(12) United States Patent
Brown

(10) Patent No.: US 6,509,704 B1
(45) Date of Patent: Jan. 21, 2003

(54) LOW PROFILE MOTOR

(75) Inventor: Fred A. Brown, Coronado, CA (US)

(73) Assignee: Comair Rotron, Inc., San Diego, CA (US)

( * ) Notice: Subject to any disclaimer, the term of this patent is extended or adjusted under 35 U.S.C. 154(b) by 0 days.

(21) Appl. No.: 09/234,649

(22) Filed: Jan. 21, 1999

Related U.S. Application Data

(60) Provisional application No. 60/072,232, filed on Jan. 23, 1998.

(51) Int. Cl.⁷ .................................................. H02P 1/18
(52) U.S. Cl. ........................ 318/254; 318/439; 388/800
(58) Field of Search ................................ 388/800–841; 318/254, 439

(56) References Cited

U.S. PATENT DOCUMENTS

| | | | | |
|---|---|---|---|---|
| 4,885,488 A | | 12/1989 | Cox ............................. 310/68 |
| 5,208,730 A | * | 5/1993 | Tracy .......................... 415/119 |
| 5,254,968 A | * | 10/1993 | Zirnheld ....................... 338/50 |
| 5,535,094 A | * | 7/1996 | Nelson et al. ............... 361/697 |
| 5,648,892 A | * | 7/1997 | Wieloch et al. ............. 361/788 |
| 5,699,854 A | * | 12/1997 | Hong .......................... 165/121 |
| 5,930,112 A | * | 7/1999 | Babinski et al. ............. 361/695 |
| 5,979,541 A | * | 11/1999 | Saito .......................... 165/80.3 |
| 6,018,288 A | * | 1/2000 | Waite et al. ................. 338/254 |
| 6,132,170 A | * | 10/2000 | Horng ......................... 415/178 |

FOREIGN PATENT DOCUMENTS

| | | |
|---|---|---|
| DE | 295 14 750 U1 | 1/1996 |
| DE | 296 15 089 U1 | 11/1996 |
| EP | 0 814 269 A2 | 12/1997 |

* cited by examiner

*Primary Examiner*—Marlon T. Fletcher
*Assistant Examiner*—Rina I. Duda
(74) *Attorney, Agent, or Firm*—Bromberg & Sunstein LLP

(57) ABSTRACT

A flat pack blower utilizes surface mounting techniques for mounting the blower electronics on a thin laminated circuit board to reduce the blower profile. To that end, the blower includes a stator, and a rotor rotatably coupled to the stator. The stator includes a coil, a pole coupled with the coil, and a laminated circuit board having blower control circuitry and pads for electrically connecting the blower control circuitry to the coil. Use of surface mounting techniques on the laminated circuit board thus eliminates the discrete electronic components and the wires connecting such components.

50 Claims, 6 Drawing Sheets

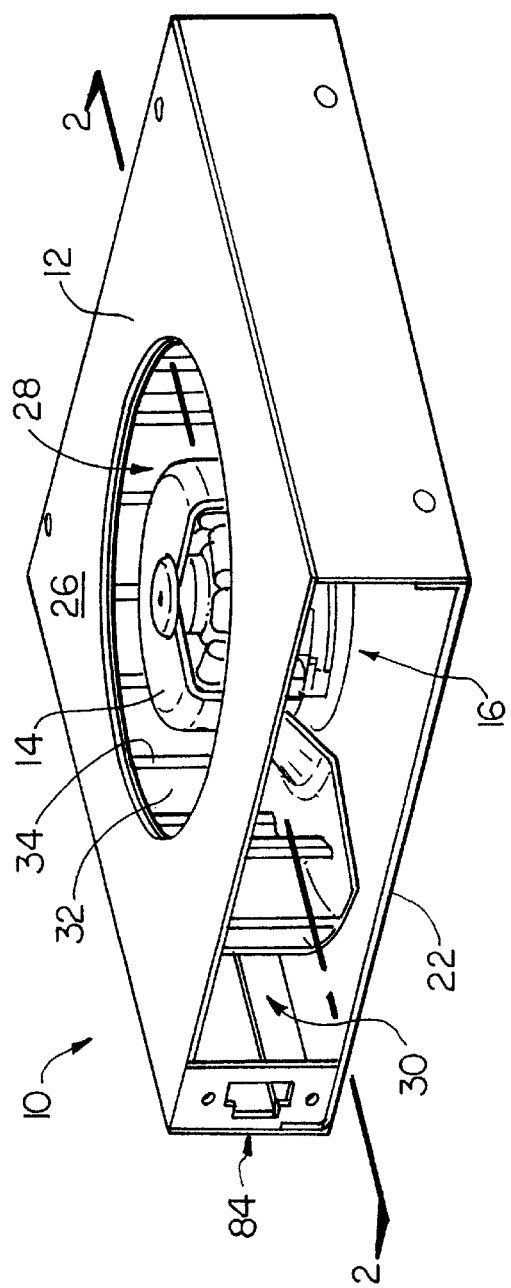
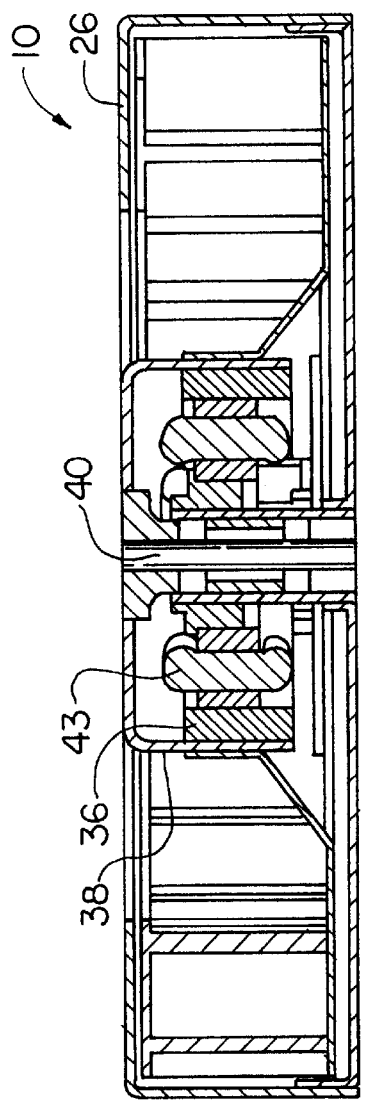
FIG. 1
FIG. 2

LOW PROFILE MOTOR

This application claims priority from provisional U.S. patent application Ser. No. 60/072,232, filed Jan. 23, 1998, entitled "LOW PROFILE BLOWER", the disclosure of which is incorporated herein, in its entirety, by reference.

FIELD OF THE INVENTION

The invention relates generally to motors and, more particularly, the invention relates to motors utilized within low profile blowers or fans that are installed for cooling purposes within the chassis of electronic equipment or other equipment.

BACKGROUND OF THE INVENTION

Flat-type blowers or fans ("flat blowers") commonly are utilized to cool electronic equipment. One exemplary flat blower is the DIPLOMAT™ blower, available from Comair Rotron, Inc. of San Ysidro, Calif. Flat blowers commonly have a relatively low profile (i.e., cross-sectional dimension) to minimize the volume that is required to mount such type of blower within electronic equipment. The above noted DIPLOMAT™ blower, for example, has a profile of about 2.5 inches.

Although relatively thin, there is a continuing need to further reduce the profile of flat blowers. For example, reducing the thickness by as little as 0.25 inches is considered a significant profile reduction. The minimum thickness of a flat blower is limited, however, by the size of the motor that rotates the blower impeller. For example, the above noted DIPLOMAT™ blower includes a motor with a rotor coupled to an impeller. In addition to poles, bearings, motor windings, and other known motor elements, the motor also includes the motor electronics (e.g., the motor control and power regulation circuitry) within a motor housing that itself is contained within a blower housing. The motor electronics within the motor housing necessarily increases the size of the stator stack (i.e., poles, coils, and circuitry), consequently increasing the minimum thickness of the blower.

In addition to having a relatively low profile, it also is desirable for a flat blower to be mountable in different configurations within the chassis of electronic equipment. The different configurations enable the blower exhaust port to direct outward air flow in a desired direction, such as away from the interior of the electronic equipment being cooled. Accordingly, the electronics in a flat blower commonly are connectible to the electronic equipment (e.g., to derive power or receive controlling data signals from the electronics) by means of one or more wires extending from the blower. Use of wires is inconvenient, however, since the wires must be manually connected to the electronics of the equipment within the equipment chassis.

SUMMARY OF THE INVENTION

In accordance with one aspect of the invention, a flat blower utilizes surface mounting techniques for mounting the blower electronics on a thin laminated circuit board to reduce the blower profile. In some embodiments, the blower has a profile of no greater than about 1.65 inches. To that end, the blower includes a stator, and a rotor rotatably coupled to the stator. The stator includes a coil, a pole coupled with the coil, and a laminated circuit board having blower control circuitry and pads for electrically connecting the blower control circuitry to the coil. Use of laminated surface mounting techniques to mount the control circuitry on the laminated circuit board thus eliminates the discrete electronic components and the wires connecting such components. In preferred embodiments, the laminated circuit board has a thickness of no greater than about 0.032 inches.

In preferred embodiments, the rotor has a bottom face with a bottom face area, and the laminated circuit board has an opposing region that is coaxial with and faces the bottom face.

The bottom face area is the same size as the area of the opposing area. The control circuitry is located outside the opposing region.

In accordance with other aspects of the invention, the blower control circuitry may include a switching circuit for switching the polarity of the coil to control rotor rotation, and regulator circuitry for regulating at least one of blower input current and voltage. The blower control circuitry also may include a Hall effect sensor, and blower performance feedback circuitry to monitor blower performance. The laminated circuit board may include circuit traces to connect each of the different elements that comprise the blower control circuitry. The different circuit elements may be laminated surface mounted circuit elements.

The blower preferably is couplable with an electronic device. The laminated circuit board thus may include a first port coupled to the blower performance feedback circuitry for receiving and transmitting signals between the blower performance feedback circuitry and the electronic device. In other embodiments, the blower includes a housing with four sides and a front face, where the front face and one of the sides each define respective air inlet and exhaust openings. The rotor preferably is configured to direct air flow into the housing through the front face air inlet and to direct air out of the housing through the exhaust opening.

In accordance with other aspects of the invention, the electronic device includes a coupler and the blower includes a connector, which is connected to the port. The connector mechanically connects with the coupler to electrically connect the port to the electronic device. The blower also may be mechanically couplable to the electronic device in first and second configurations. The connector may be mountable on the blower at a first location when the blower is mounted in the first configuration. In a similar manner, the connector may be mountable on the blower at a second location when the blower is mounted in the second configuration. Moreover, the housing may have a light emitting diode on one or more of the surfaces of the housing.

In accordance with still another aspect of the invention, circuit elements in a motor are distributed to reduce the motor profile. To that end, the motor includes a stator, a rotor coupled to the stator and having a bottom face with a bottom face area, and a laminated circuit board having circuitry that controls the rotation of the rotor. The laminated circuit board has an opposing region with an opposing region area that is identical to the bottom face area. The bottom face is coaxial with the opposing region. The circuitry preferably is positioned on the circuit board so that it is not within the opposing region on the laminated circuit board.

In preferred embodiments, the bottom face of the rotor is spaced from the opposite region of the laminated circuit board. The circuit board may include other circuitry that is not within the opposing region. In addition, the circuit board preferably includes either or both of laminated surface mounted circuit elements and discrete circuit elements. The circuit elements may include a number of elements, including resistors or transistors. In other embodiments, the circuit elements includes a switching circuit for controlling the rotation of the rotor. The circuit elements preferably are connected by circuit traces laminated onto the laminated circuit board.

In other embodiments, the rotor includes an impeller. The motor also may include a housing for containing the rotor, stator, and laminated circuit board. The laminated circuit board preferably is mounted upon a rear face of the housing. In some embodiments, the bottom face and opposing region are circularly shaped. In preferred embodiments, however, the bottom face and opposing region are both toroidally shaped (i.e., ring-shaped, similar to a doughnut).

In accordance with other aspects of the invention, a motor includes a stator, a rotor coupled to the stator and having a bottom face with a bottom face area, a housing with a housing interior, and circuitry that controls the rotation of the rotor. The housing has an interior region that faces the bottom face of the rotor, and has an identical area to the bottom face area. In preferred embodiments, the bottom face also is coaxial with the opposing region. The circuitry preferably is positioned within the housing so that it is not within the opposing region on the laminated circuit board.

In many embodiments, the opposing region may include a volume extending from the bottom face of the rotor, to a bottom interior surface of the housing. In some embodiments, the circuitry is mounted to interior walls of the housing. In other embodiments, the motor includes a laminated circuit board mounted to the side wall of the housing. The circuitry may be mounted to such laminated circuit board.

BRIEF DESCRIPTION OF THE DRAWINGS

The foregoing and other objects and advantages of the invention will be appreciated more fully from the following further description thereof with reference to the accompanying drawings wherein:

FIG. 1 is a perspective view of a flat blower manufactured in accordance with preferred embodiments of the invention.

FIG. 2 is a cross-sectional view of the blower shown in FIG. 1 taken across line 2—2 in FIG. 1.

DESCRIPTION OF PREFERRED EMBODIMENTS

Figure 3A:
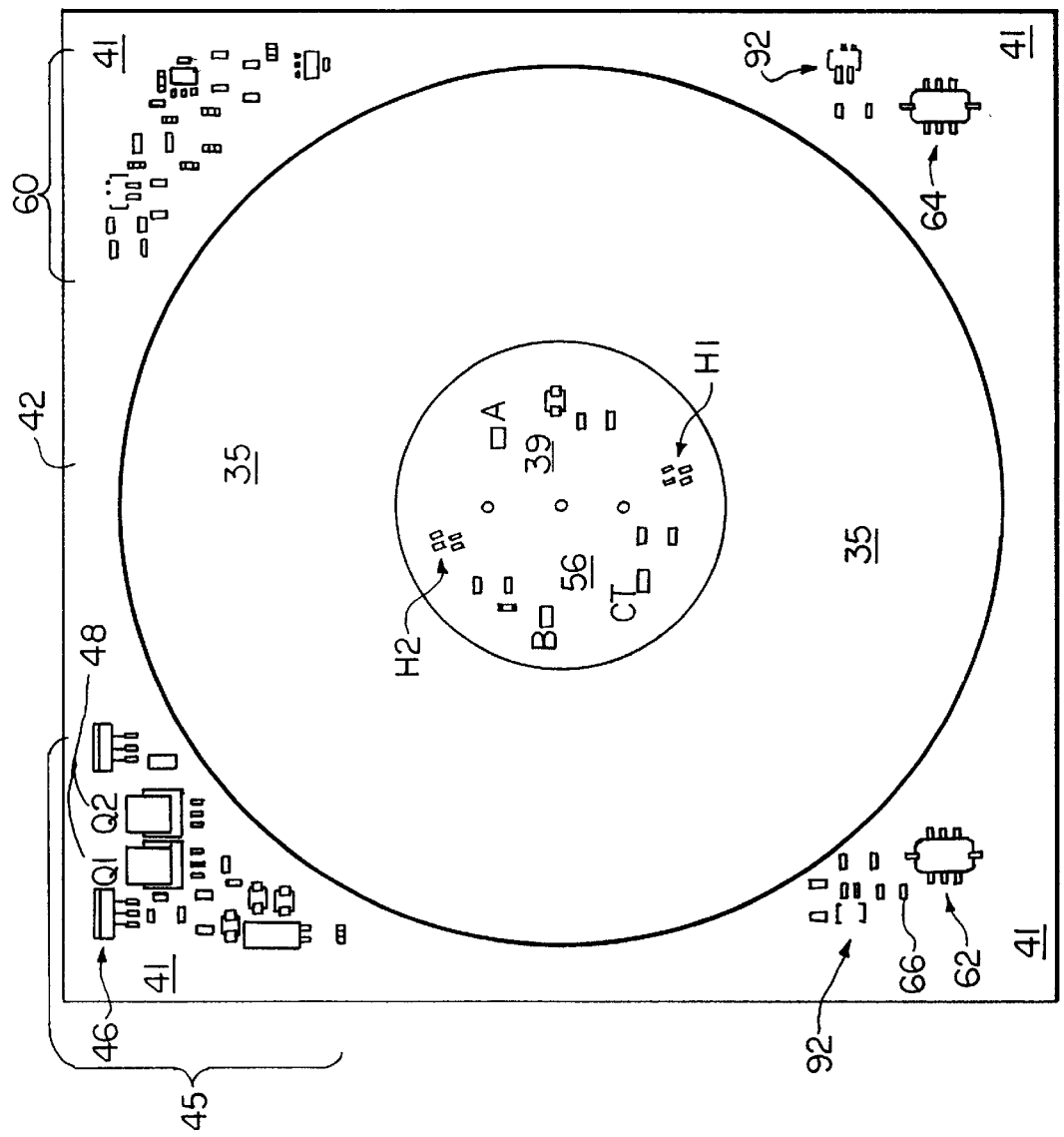
FIG. 3A is a plan view of a laminated printed circuit board within the blower shown in FIG. 1.

FIGS. 1 and 2 show an exemplary four pole, direct current flat blower 10 that may be configured in accordance with preferred embodiments of the invention. It should be noted that various embodiments of the invention may be applied to other blower or fan type such as, for example, those with two poles, or those configured for use with alternating current (i.e., A.C. blowers). As described below, the preferred blower may be considered to be a distributed version of a conventional motor since the motor elements are distributed across the interior of the blower. Accordingly, the term "blower" and "motor" may be used interchangeably herein when defining and describing various embodiments of the invention.

The blower 10 includes a housing 12 containing a rotor 14 rotatably mounted on a stator 16. As discussed in greater detail below (FIG. 6), the housing 12 preferably includes four sides and a front face 26, and is manufactured from sheet metal. The front face 26 preferably has a thickness of about 0.050 inches while the remainder of the housing 12 preferably has a thickness of about 0.78 inches. The front face 26 includes an inlet opening 28 for receiving air, and one of the four sides 22 includes an exhaust opening 30 for blowing air from within the housing 12.

The rotor 14 preferably includes a backward curved impeller 32 coupled about a steel cup 38. The impeller 32 includes a plurality of vanes 34 and a bottom surface 33 (FIG. 3A). When rotating in a clockwise direction, the impeller 32 draws air into the housing 12 via the inlet opening 28, and exhausts air from the housing 12 via the exhaust opening 30. In preferred embodiments, the rotor 14 further includes an annular permanent magnet 36 within the cup 38. The magnet 36 preferably has a first south portion with a south pole facing inwardly, a first north portion with a north pole facing inwardly, a second south portion with a south pole facing inwardly, and a second north portion with a north pole facing inwardly with nulls 180 degrees opposed. In preferred embodiments, the magnet portions each respectively circumscribe about ninety degrees of the steel cup 38 in a commutation portion of the magnet 36. A central shaft 40, which is secured to an end face of the cup 38, is received in bearings (not shown) in the stator assembly 16 when the blower 10 is assembled.

Figure 4:
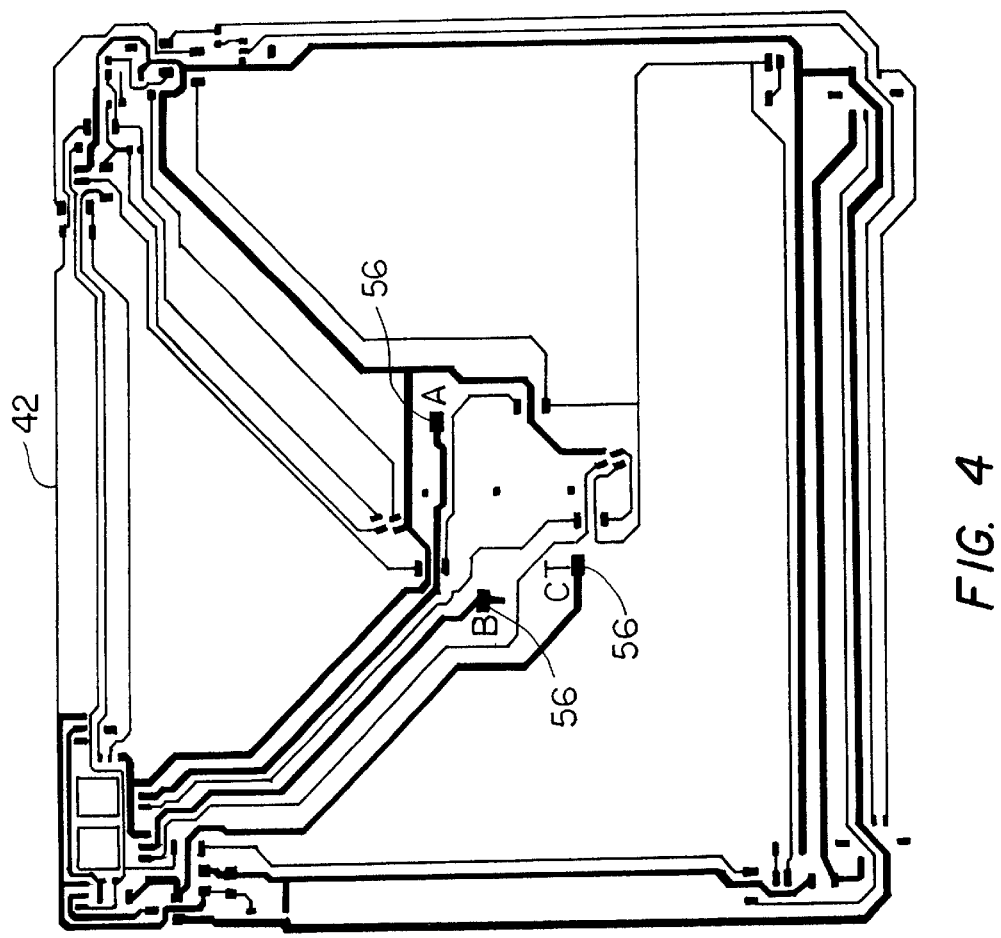
FIG. 4 is a plan view of the connections in the laminated printed circuit board shown in FIG. 4.
Figure 5:
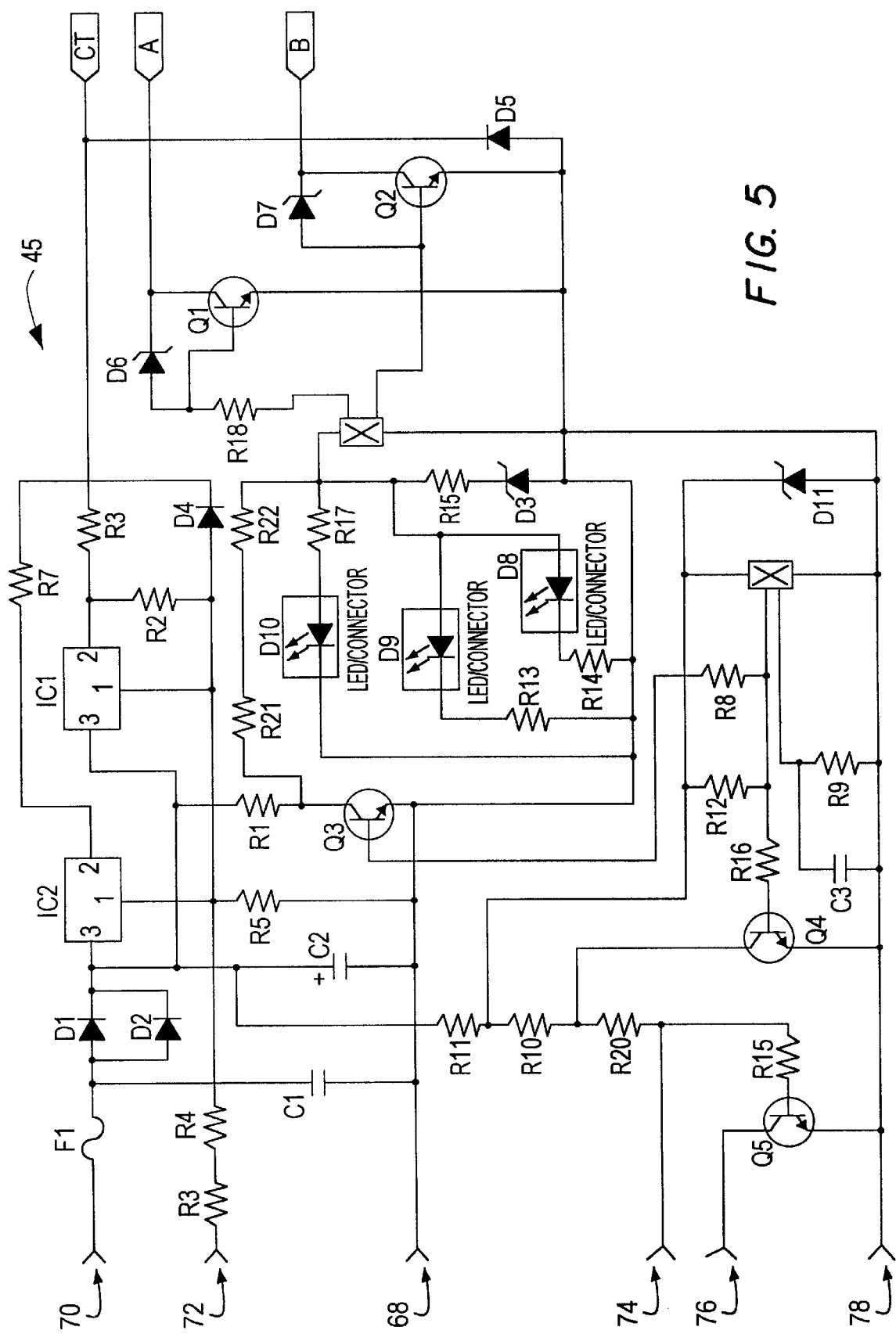
FIG. 5 is a schematic diagram of the electronic components and their connections on the laminated printed circuit board shown in FIG. 3.

The stator 16 includes four poles that each are alternately energized by two respective coils 43, and blower controlling circuitry 45 that, among other functions, controls the energization of the two coils 43. In accordance with preferred embodiments of the invention, the controlling circuitry 45 is mounted on a laminated printed circuit board ("circuit board 42") by means of conventional electronic laminated surface mounting techniques. FIG. 3A shows the position of the various electronic components on preferred embodiments of the circuit board 42, while FIG. 4 shows the connecting pads (a/k/a "traces") between such electronic components. FIG. 5 schematically shows the various electronic components in FIGS. 3A and 4, together with their connections. It should be noted that although specific combinations of circuit elements are disclosed (e.g., the circuit diagram in FIG. 5), any conventionally known combination of circuit elements may be utilized with preferred embodiments of the invention. For example, any known switching circuit may be used as long as the elements are distributively mounted in accord with preferred embodiments. Additional details are discussed below.

In accord with preferred embodiments of the invention, the circuit elements are selectively located and mounted on the laminated circuit board 42 in a manner that reduces the profile of the blower 10. To that end, the circuit elements preferably are mounted on the circuit board 42 so that they are not within a toroidally-shaped region (i.e., doughnut-shaped or ring-shaped region) on the circuit board 42 that opposes the bottom surface 33 of the rotor. This region is shown in detail in FIG. 3A, and is referred to herein as "opposing region 35."

Figure 3B:
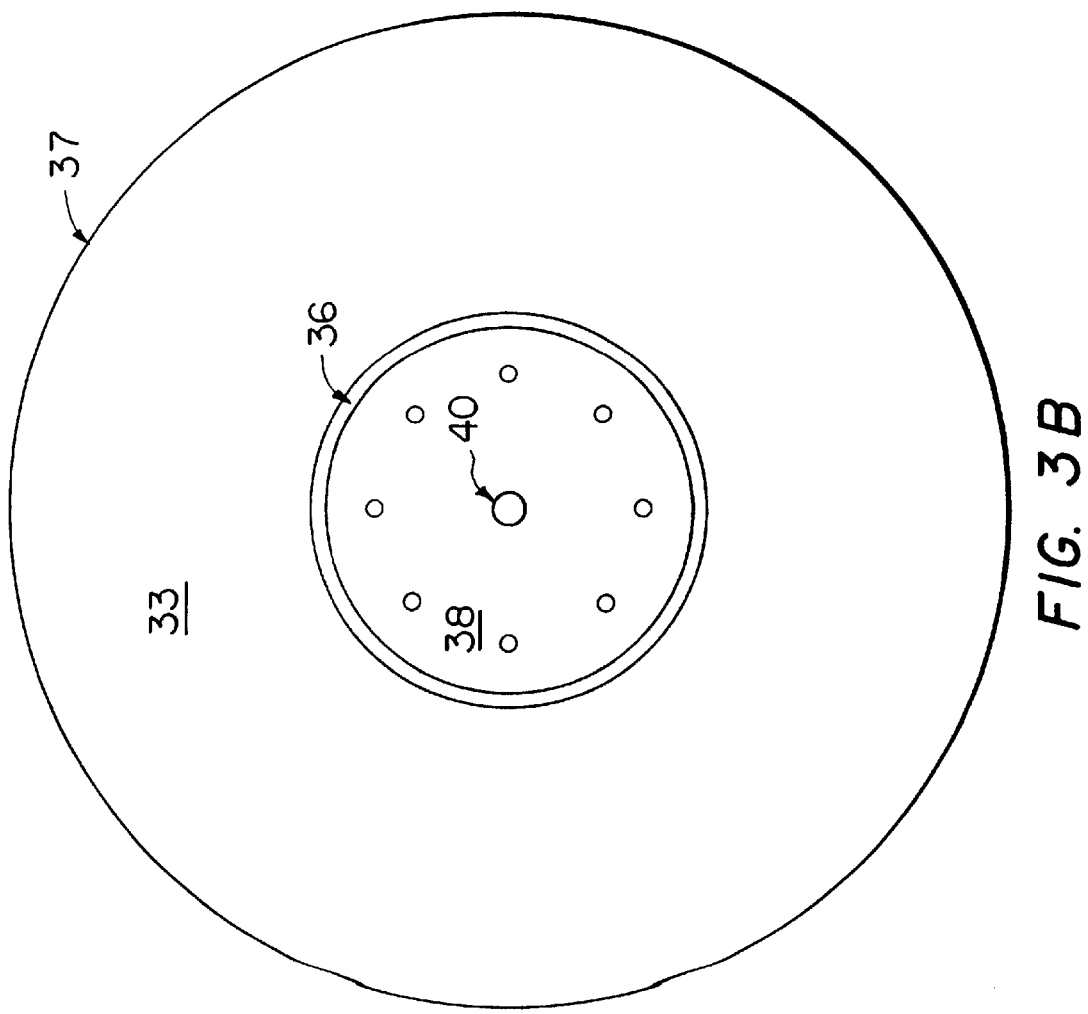
FIG. 3B is a plan view of a bottom surface of an impeller within the flat blower shown in FIG. 1.

More particularly, FIG. 3B shows a plan view of the bottom surface 33 of the impeller 32, which is defined by the radial area between the steel cup 38 and the outside rim 37 of the impeller. The bottom surface 33 directly faces, but does not contact, the opposing region 35 of the circuit board 42. The bottom surface 33 therefore does not face the other portions of the circuit board 42. Accordingly, the circuit elements preferably are mounted in a middle region 39 and corner regions 41 of the circuit board 42 (FIG. 3A). As shown in FIG. 3A, the opposing region 35 preferably has an identical area to that of the bottom surface 33 of the impeller. Moreover, the opposing region 35 preferably is coaxial with the bottom surface 33 of the impeller. During operation, the bottom surface 33 of the impeller rotates a very small distance above the entire opposing surface of the circuit board 42. In preferred embodiments, this very small distance is about 0.25–0.35 inches. As noted above and below, all circuit elements and traces preferably are laminated surface mounted circuit elements.

Accordingly, instead of being mounted on a printed circuit board within a motor housing, the motor circuitry is distributed about the interior of the blower 10 on the circuit board 42. In preferred embodiments, the circuit board 42 is about the same size as, and directly mounted to, the rear face of the blower housing. This distributed motor arrangement consequently reduces the profile of the blower 10, thus permitting it to be disposed within a smaller slot in equipment being cooled. Regardless of the function, the blower 10 may be considered to be a motor with a coupled impeller. Principles of preferred embodiments therefore may be applied to motors used in other applications.

In alternative embodiments, laminated circuit elements may be mounted within the opposing region 35 of the circuit board 42. In yet other embodiments, either or both discrete non-laminated circuit elements (e.g., conventional resistors and transistors) and laminated circuit elements are mounted outside of the opposing region 35. In still other embodiments, circuit elements are coupled with the interior walls of the housing 12 on one or more laminated circuit boards. These laminated circuit boards may be used in addition to, or in lieu of, the discussed circuit board 42.

Details are described below of the various circuit sub-systems of an exemplary blower 10 with the motor elements arranged in a manner similar to the preferred embodiment. It should be reiterated, however, that any combination of circuit sub-systems known in the art may be employed. Some of the disclosed circuit sub-systems may be omitted completely from the blower. In a similar manner, the disclosed circuit sub-systems may be configured differently than described, such as with different circuit elements or different circuit element values. It therefore should be understood that those skilled in the art could arrange the circuit sub-systems to meet conventionally attainable performance requirements for the blower 10. Accordingly, preferred embodiments of the invention are not intended to be limited to the circuit configurations disclosed, such as those shown in FIG. 5.

The circuit board 42 preferably is manufactured with a base of FR4 glass/epoxy printed circuit board material having a thickness of about 0.030 inches. Such thickness should provide a sufficient structural support for the circuit board 42. Nevertheless, a thinner printed circuit board material may be utilized if desired. In alternative embodiments, the base material may be CEM3 glass/epoxy printed circuit board material. A layer of copper having a thickness of about 0.001–0.002 inches may be laminated onto the base and then etched, in accordance with conventional processes, to produce the circuit pads (FIG. 4). In high current applications, however, the copper layer may be about 0.002 inches thick. Once the pads are produced, then the electronic elements may be positioned in the appropriate locations on the circuit board 42 (FIG. 3A) in accordance with conventional electronic surface mounting techniques. In preferred embodiments, the circuit elements have a profile of about 0.001–0.002 inches. When completely manufactured, the preferred circuit board 42 should have a profile of about 0.032 inches. As a result of the decreased circuit board profile, the rotor 14 may be positioned closer to the bottom of the stator 16, thus decreasing the profile of the blower 10.

As shown in FIGS. 3A and 5, the blower controlling circuitry 45 on the circuit board 42 includes a plurality of electronic sub-systems that cooperate to control blower operation (e.g., rotation of the impeller 32). Each of the sub-systems may be configured to control blower performance in accordance with conventional processes. Among the controlling circuitry 45 sub-systems is a rotor controller 46 to control the rotation of the rotor 14, and a switching circuit 48 for alternatively energizing the coils 43. Among other things, the rotor controller 46 functions as a regulator circuit for regulating input voltage to control speed and air flow as desired, a current protection circuit for protecting the circuit board 42 from current surges, and a thermal protection circuit. The switching circuit 48 preferably includes switching devices Q1 and Q2 which, in preferred embodiments, are model number STP32NGL MOSFETs, available from SGS Thompson Microelectronics of Phoenix, Arizona. The rotor controller 46 preferably includes model number LM317T series and current limiters, also available from SGS Thompson Microelectronics. A number of resistors, capacitors, and diodes also are utilized in the rotor controller 46 in connection with its various circuits.

The blower controlling circuitry 45 also includes a plurality of coil connectors 56 (i.e., electrical connecting pads, FIG. 4) for connecting the coils 43 to the rotor controller circuitry 46, and two Hall effect sensors H1 and H2 to sense the rotation of the rotor 14. No wires are necessary to connect the coils 43 to the rotor control circuitry since the pads are utilized. The first coil 43 couples with the pads at point "A" in FIGS. 3A, 4 and 5, while the second coil 43 couples with the pads at point "B" in FIGS. 3A, 4, and 5. The point designated as "CT" is a coil center-tap. As is known in the art, the Hall sensors Hi and H2 sense the changing magnetic field produced by the rotating magnet 36 in the rotor 14 as the rotor 14 rotates, and direct a signal to the switching circuit 48 to switch the polarity of the coils 43. In preferred embodiments, one of the Hall sensors is a model number SS42 Hall effect sensor, available from Honeywell Microswitch Incorporated of Freeport, Illinois. The other Hall sensor (used with feedback performance circuitry discussed below) preferably is a model number SS421 Hall effect sensor, also available from Honeywell Microswitch.

A blower performance feedback circuit 60 also is included as a part of the blower controlling circuitry 45. Among the functions performed by the performance feedback circuit 60 is delivering a signal to the electronic device being cooled (not shown) indicating the speed of the rotor 14 in revolutions per minute. In addition, the feedback circuit 60 can receive a signal from the electronic device that causes the rotor 14 to rotate at a faster or slower rate. Among the circuit components in the feedback circuit 60 is a transistor Q5 which, in preferred embodiments, is a type SDT 223 transistor.

Also located on the circuit board 42 are two ports 62 and 64 for connecting the circuit board 42 to the electronic device being cooled or other electronic device, and a fuse 66 for protecting against power surges. As shown in FIG. 3A, a first port 62 is located on the lower left corner of the circuit board 42, and a second port 64 is located on the lower right corner of the circuit board 42. Both ports 62 and 64 preferably each include six or more leads for connecting with a connector that couples with the electronic device. Each lead on port 62 is directly coupled with a corresponding lead on port 64. As shown in FIG. 5, each port 62 and 64 has the following leads:

a ground return lead 68;

a positive input lead 70;

an external control programmable lead 72;

a non-inverted output lead 74;

an inverted output lead 76; and a blower performance sensor ground return lead 78.

Figure 7:
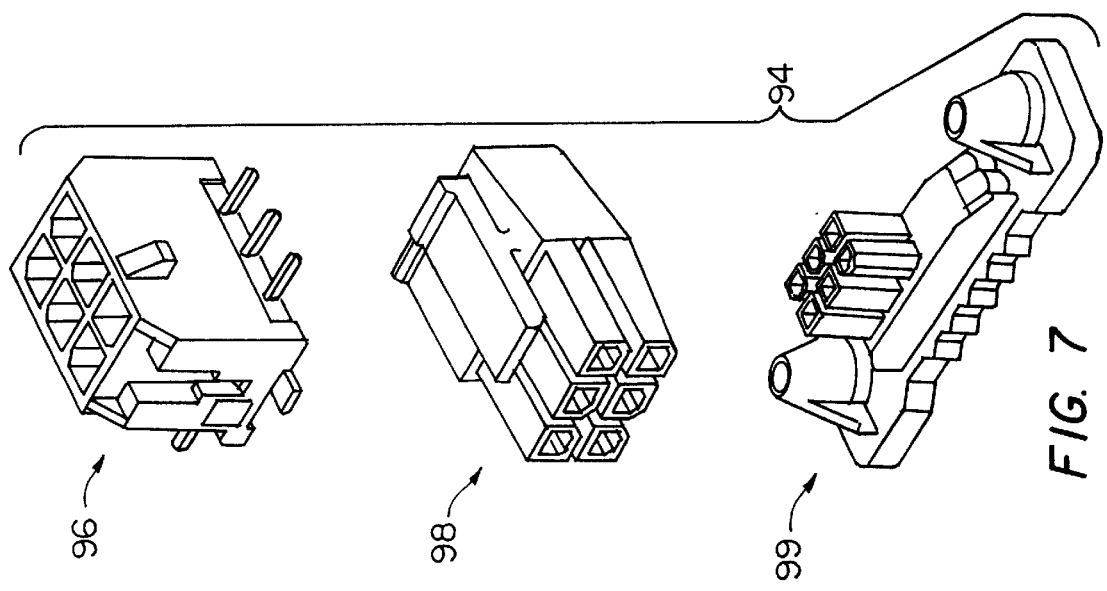
FIG. 7 schematically shows a connector for connecting the laminated printed circuit board with an electronic device being cooled.

All of the sub-systems on the circuit board 42 are electrically accessible by connection to either of the two ports 62 and 64. In preferred embodiments and as discussed in detail below, a six pronged connector 94 (FIG. 7) connects to the six leads.

Figure 6:
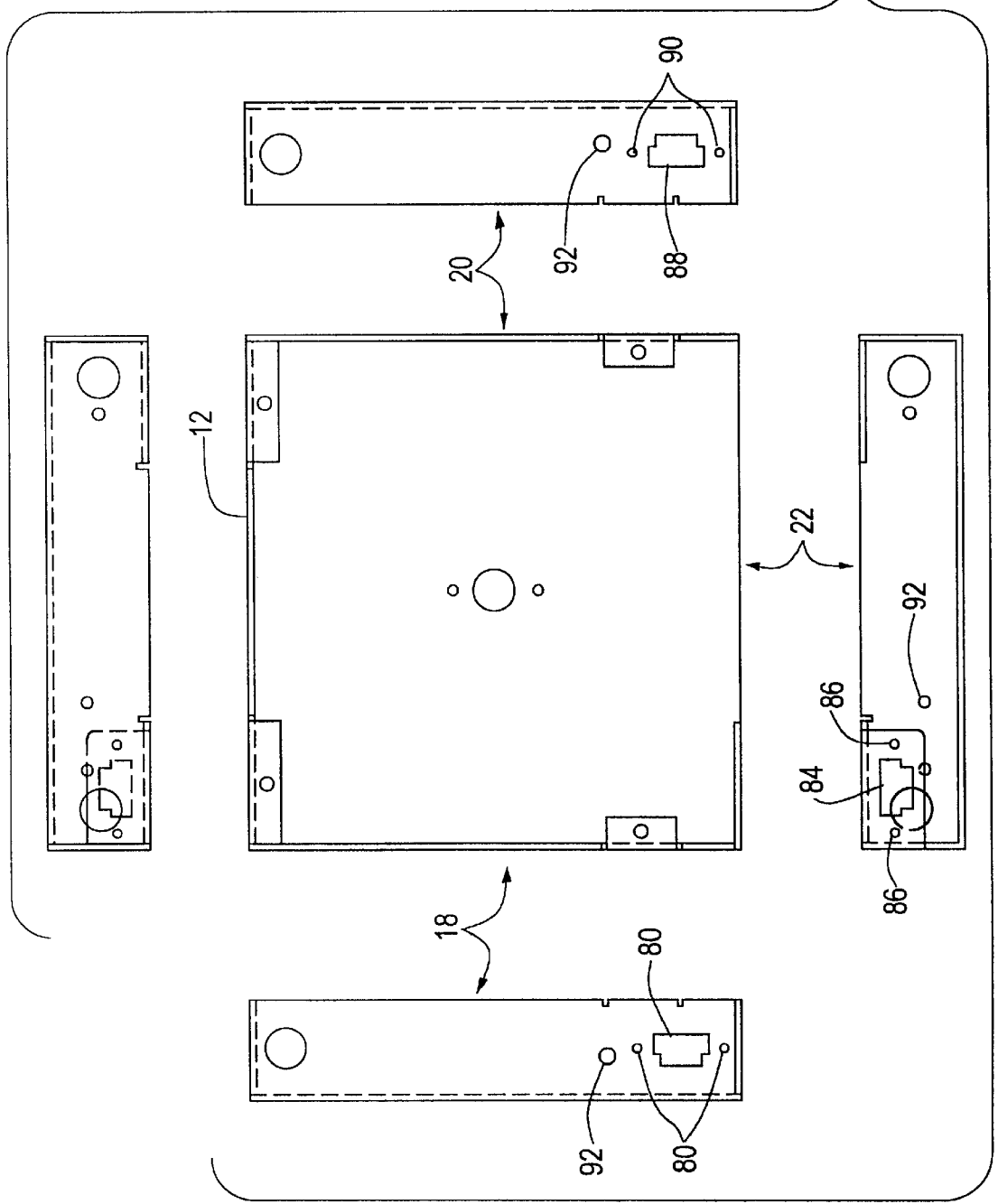
FIG. 6 is a schematic diagram of the mounting surfaces on the blower housing for mounting an electrical connector to the blower.

FIG. 6 shows the housing 12 in detail and the mounting points on the housing 12 for the connector 94. In particular, FIG. 6 shows the left side 18, exhaust side 22, and right side 20 of the housing 12. Note that although portions of preferred embodiments are described in relational terms (e.g., left and right sides), these terms are utilized for references purposes only and do not necessarily limit the preferred embodiment in any manner.

The left side 18 includes a left mounting area 80 having a hole for enabling the connector 94 to couple with the first port 62 on the circuit board 42 within the housing 12. The connector 94 may be secured to the housing 12 via screw holes 82 with screws, prongs, or other similar coupling elements. In a similar manner, the exhaust side 22 also includes a exhaust mounting area 84 for enabling the connector 94 to couple with the first port 62 within the housing 12. Like the left mounting area 80, the connector 94 also may be secured to the housing 12 via screw holes 86. Accordingly, both the left and exhaust mounting areas 80 and 84 utilize the first port 62. Conversely, the right side housing 20 includes a right mounting area 88 for enabling the connector 94 to couple with the second port 64 (and not the first port 62) within the housing 12. Screw holes 90 may be used to secure the connector 94 to the housing 12. A light emitting diode 92, coupled to the circuit board 42, may be positioned next to each mounting area to indicate the status of the blower 10. For example, the light emitting diode 92 may have a green display to indicate that power is being supplied to the blower 10.

The connector 94 is mounted to the appropriate mounting area of the blower 10 based upon the location of a coupling device within the electronic device. More particularly, in preferred embodiments, the electronic device includes a coupler (not shown) for coupling with the connector 94 to provide an electrical path between the electronic device and the circuit board 42. The coupler preferably is generally rigid and located in a relatively non-movable location within a socket in the electronic device that secures the blower 10. Accordingly, the connector 94 must be positioned on the blower housing 12 at a location that couples with the coupler after the blower 10 is slid into the socket. Since the blower 10 can be positioned in the socket in several different configurations (i.e., directing the exhaust air in several different directions), there must be a location on the blower housing 12 for the connector 94 to complimentarily couple with the coupler when the blower 10 is secured in the housing 12. It thus follows that the connector 94 is mounted to the appropriate mounting surface based upon the predetermined location of the coupler.

In preferred embodiments, the connector 94 includes a plurality of elements that together couple with the coupler. Specifically, a Molex model number 43045 connector ("'045 connector 96") may be connected to the circuit board 42 to provide the function of the leads 68–78. A Molex model number 43025 connector ("'025 connector 98") then is connected to the '045 connector 96 via a conventional wire or mating interface. A Molex 42474 connector ( "'474 connector 99") then is screwed into the appropriate mounting port and coupled to the '025 connector 98. The '025 connector 98 and '045 connector 96 may be permanently connected to the circuit board 42 while the '474 connector 99 may be moved to the appropriate mounting port. Each of these connectors are available from Molex, Inc., of Lisle, Ill.

When fully assembled, the blower 10 preferably has a maximum profile of about 1.65 inches, a length of about 8.25 inches, and a width of about 8.25 inches. The blower 10 also preferably has a rated air flow of about 120 cubic feet per minute. Of course, the techniques discussed herein may be applied to other types of fans and blowers, as well as other flat blowers having different length and width dimensions, and different air flow requirements.

Accordingly, the blower 10 may be easily positioned within a smaller socket in the electronic device being cooled. Although a socket has been described, however, it should be evident that preferred embodiments of the blower 10 may be mounted to the electronic device in any other known manner. Moreover, the blower 10 may be positioned in any number of configurations to point the exhaust side 22 in a desired direction.

Although various exemplary embodiments of the invention have been disclosed, it should be apparent to those skilled in the art that various changes and modifications can be made which will achieve some of the advantages of the invention without departing from the true scope of the invention. These and other obvious modifications are intended to be covered by the appended claims.

Having thus described the invention, what we desire to claim and secure by Letters Patent is:

1. A blower comprising:

a stator having a coil, a pole coupled with the coil, and a laminated circuit board;

a rear housing face supporting the laminated circuit board, the rear housing face defining a blower boundary, the laminated circuit board not extending outside the blower boundary and including blower control circuitry and pads for electrically connecting the blower control circuitry to the coil; and a rotor assembly mounted to the stator and controlled by the blower control circuitry;

wherein a distance of the rotor assembly above the laminated circuit board defines a clearance distance, and wherein the clearance distance plus a thickness of the laminated circuit board equals more than three percent and less than five percent of a total profile of the blower.

2. The blower as defined by claim 1 wherein the blower control circuitry includes a switching circuit for switching the polarity of the coil to control rotation of the rotor assembly.

3. The blower as defined by claim 1 wherein the blower control circuitry includes regulator circuitry for regulating at least one of blower input current and voltage.

4. The blower as defined by claim 1 wherein the rotor assembly comprises a cup and an impeller, the impeller having a bottom face with a bottom face area, the laminated circuit board having an opposing region that is coaxial with and faces the bottom face, the bottom face area being the same as the area of the opposing region, the control circuitry being outside the opposing region.

5. The blower as defined by claim 1 wherein the blower control circuitry includes blower performance feedback circuitry to monitor blower performance.

6. The blower as defined by claim 1 wherein the blower is couplable with an electronic device, the laminated circuit board including a first port coupled to the blower performance feedback circuitry for receiving and transmitting signals between the blower performance feedback circuitry and the electronic device.

7. The blower as defined by claim 1 wherein the laminated circuit board has a thickness of no greater than about 0.032 inches.

8. The blower as defined by claim 1 wherein the blower includes a housing with four sides and a front face, the front face and one of the four sides each defining an opening, the rotor assembly configured to direct air flow into the housing through the front face and out of the housing through the one of the four sides.

9. The blower as defined by claim 8 wherein the blower housing also includes the rear housing face, the rear housing face and front face being spaced apart a distance of no greater than about 1.65 inches.

10. The blower as defined by claim 8 wherein the rotor assembly extends toward the front face to a plane that is no greater than about 1.65 inches from the rear face.

11. The blower as defined by claim 1 wherein the total blower profile is no greater than about 1.65 inches.

12. The blower as defined by claim 1 wherein the blower is a flat blower.

13. The blower as defined by claim 1 wherein the blower control circuitry includes at least two electrically equivalent ports for receiving electronic signals from an electronic device.

14. A flat blower comprising:
    a stator having a coil at least partially wrapped about a pole, and a laminated circuit board;
    a rotor assembly mounted to the stator; and
    a housing having an interior, the laminated circuit board being contained within the interior of the housing and including blower control circuitry for controlling rotation of the rotor, the blower control circuitry being circuit elements comprising laminated surface mounted circuit elements;
    wherein a distance of the rotor assembly above the laminated circuit board defines a clearance distance;
    and wherein the clearance distance plus a thickness of the laminated circuit board equals more than tree percent and less than five percent of a total profile of the blower.

15. The flat blower as defined by claim 14 wherein the blower control circuitry includes a Hall effect sensor.

16. The flat blower as defined by claim 14 wherein the blower control circuitry includes a regulator for regulating at least one of blower input voltage and current.

17. The flat blower as defined by claim 14 wherein the laminated circuit board includes connectors for electrically connecting the coil to the blower control circuitry.

18. The flat blower as defined by claim 14 wherein the blower control circuitry includes blower performance feedback circuitry to monitor blower performance.

19. The flat blower as defined by claim 14 wherein the blower control circuitry includes a switching circuit for switching the polarity of the coil to control rotation of the rotor assembly.

20. The flat blower as defined by claim 14 wherein the total blower profile is no greater than about 1.65 inches.

21. The flat blower as defined by claim 14 wherein the laminated circuit board has a profile that is no greater than about 0.032 inches.

22. The flat blower as defined by claim 14 wherein the blower control circuitry includes at least two electrically equivalent ports for receiving electronic signals from an electronic device.

23. The blower as defined by claim 14 wherein the rotor assembly comprises a cup and an impeller, the impeller having a bottom face with a bottom face area, the laminated circuit board having an opposing region that is coaxial with and faces the bottom face, the bottom face area being the same as the area of the opposing region, the control circuitry being outside the opposing region.

24. A motor for use with an electronic device, the motor comprising:
    a stator having a pole, a coil at least partially wrapped about the pole, and motor control circuitry; and
    a rotor assembly rotatably mounted to the stator, the motor control circuitry controlling rotation of the rotor assembly,
    the motor control circuitry including at least two electrically equivalent ports for receiving electronic signals from the electronic device.

25. The motor as defined by claim 24 wherein the electronic signals include power signals.

26. The motor as defined by claim 24 wherein the electronic signals include control signals to control rotation of the rotor assembly.

27. The motor as defined by claim 24 wherein at least one port transmits status electronic signals to the electronic device.

28. The motor as defined by claim 27 wherein the status electronic signals include motor performance data.

29. The motor as defined by claim 24 wherein the electronic device includes a coupler, the motor further including a connector connected to one of the at least two ports, the connector mechanically connecting with the coupler to electrically connect the one of the at least two ports with the electronic device.

30. The motor as defined by claim 29 wherein the motor is mechanically couplable to the electronic device in first and second configurations, the connector being mechanically mountable at a first location on the motor to connect with the coupler when the motor is mounted in the first configuration, the connector being mechanically mountable at a second location on the motor to connect with the coupler when the motor is mounted in the second configuration.

31. The motor as defined by claim 30 further comprising a housing having a plurality of surfaces, at least one of the surfaces including a light emitting diode coupled to the motor control circuitry.

32. The motor as defined by claim 24 further including a laminated circuit board having pads for connecting the coil to the motor control circuitry.

33. The motor as defined by claim 24 wherein the two ports are electrically connected.

34. The motor as defined by claim 24 wherein the motor is a flat blower having a profile of no greater than about 1.65 inches.

35. A motor comprising:
    a stator,
    a rotor assembly comprising a cup and an impeller mounted about the cup, the impeller having a bottom face with a bottom face area, the rotor assembly being coupled to the stator;

a laminated circuit board having circuitry that controls rotation of the rotor assembly, the laminated circuit board not extending outside a boundary of the motor and having an opposing region that faces the bottom face, the opposing region having an opposing region area that is identical to the bottom face area, the bottom face being coaxial with the opposing region, the circuitry being positioned on the circuit board so that it is not within the opposing region on the laminated circuit board;

wherein a distance of the rotor assembly above the laminated circuit board defines a clearance distance, and wherein the clearance distance plus a thickness of the laminated circuit board equals more than three percent and less than five percent of a total profile of the motor.

36. The motor as defined by claim 35 wherein the bottom face of the impeller is spaced apart from the opposing region.

37. The motor as defined by claim 35 wherein the circuit board includes laminated surface mounted circuit elements.

38. The motor as defined by claim 37 wherein the circuit elements include a resistor.

39. The motor as defined by claim 37 wherein the circuit board includes means for controlling rotation of the rotor assembly.

40. The motor as defined by claim 37 wherein the circuit elements include a transistor.

41. The motor as defined by claim 35 wherein the circuit board includes discrete circuit elements that are mounted outside of the opposing region.

42. The motor as defined by claim 35 wherein the circuitry includes a plurality of circuit elements, the plurality of circuit elements being connected by circuit traces laminated onto the laminated circuit board.

43. The motor as defined by claim 35 further comprising:

a housing for containing the rotor assembly, stator, and laminated circuit board.

44. The motor as defined by claim 43 wherein the housing includes a rear face, the laminated circuit board being mounted to the rear face.

45. The motor as defined by claim 35 wherein the circuitry includes a switching circuit for controlling rotation of the rotor assembly.

46. The motor as defined by claim 35 wherein the bottom face and opposing region are circularly shaped.

47. The motor as defined by claim 35 wherein the bottom face and opposing region are the same shape, the opposing region being a region formed between a circle of larger diameter and a circle of smaller diameter.

48. A motor comprising:

a stator comprising a first laminated circuit board;

a rotor assembly having a bottom face with a bottom face area, the bottom face area being a region formed between a circle of lager diameter and a circle of smaller diameter, the rotor assembly being coupled to the stator;

a housing having a housing interior with an opposing region that faces the bottom face, the opposing region having an opposing region area that is identical to the bottom face area, the bottom face being coaxial with the opposing region; and circuitry that controls rotation of the rotor assembly, the circuitry being positioned within the housing so that it is not within the opposing region;

wherein a distance of the rotor assembly above the first laminated circuit board defines a clearance distance, and wherein the clearance distance plus a thickness of the first laminated circuit board equals more than three percent and less than five percent of a total profile of the motor.

49. The motor as defined by claim 48 wherein the housing includes a side wall, the circuitry being mounted on the side wall.

50. The motor as defined by claim 49 further comprising a second laminated circuit board mounted to the side wall, the circuitry being mounted to the second laminated circuit board.

* * * * *

UNITED STATES PATENT AND TRADEMARK OFFICE
CERTIFICATE OF CORRECTION

PATENT NO. : 6,509,704 B1
DATED : January 21, 2003
INVENTOR(S) : Fred A. Brown

It is certified that error appears in the above-identified patent and that said Letters Patent is hereby corrected as shown below:

Column 9,
Line 52, change "tree" to -- three --

Signed and Sealed this

Eleventh Day of March, 2003

JAMES E. ROGAN
*Director of the United States Patent and Trademark Office*